United States Patent
Chu

(10) Patent No.: US 8,400,829 B2
(45) Date of Patent: Mar. 19, 2013

(54) SEMICONDUCTOR MEMORY DEVICE AND METHOD OF OPERATING THE SAME

(75) Inventor: Gyo Soo Chu, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 137 days.

(21) Appl. No.: 12/982,746

(22) Filed: Dec. 30, 2010

(65) Prior Publication Data
US 2011/0157988 A1 Jun. 30, 2011

(30) Foreign Application Priority Data
Dec. 31, 2009 (KR) .................. 10-2009-0135641

(51) Int. Cl.
*G11C 16/04* (2006.01)
(52) U.S. Cl. .......... 365/185.11; 365/185.27; 365/189.09
(58) Field of Classification Search ............ 365/185.11, 365/185.27, 185.29, 189.09, 189.11
See application file for complete search history.

(56) References Cited

U.S. PATENT DOCUMENTS
6,414,874 B2 * 7/2002 Akaogi ................. 365/185.11
7,280,407 B2 * 10/2007 Umezawa et al. ....... 365/185.25

FOREIGN PATENT DOCUMENTS
| KR | 1020020054511 A | 7/2002 |
| KR | 10-2002-0056210 A | 10/2002 |
| KR | 10-2006-0073747 A | 6/2006 |
| KR | 10-2008-0044163 A | 5/2008 |

* cited by examiner

*Primary Examiner* — David Lam
(74) *Attorney, Agent, or Firm* — William Park & Associates Ltd.

(57) ABSTRACT

A semiconductor memory device includes memory blocks each comprising a plurality of memory cells formed over a semiconductor substrate having a P well, a first voltage generator supplying operating voltages to an selected block of the memory blocks, and a second voltage generator generating a negative voltage to the P well during a program operation.

19 Claims, 8 Drawing Sheets

SEMICONDUCTOR MEMORY DEVICE AND METHOD OF OPERATING THE SAME

CROSS-REFERENCE TO RELATED APPLICATION

Priority is claimed to Korean patent application number 10-2009-0135641 filed on Dec. 31, 2009, the entire disclosure of which is incorporated by reference herein.

BACKGROUND

Exemplary embodiments relate to a semiconductor memory device and a method of operating the same.

Semiconductor memory devices are storage devices in which data can be stored and from which the stored data can be read as needed. The semiconductor memory devices are chiefly divided into random access memory (RAM) and read only memory (ROM). Data stored in RAM is lost when power is not supplied. This type of memory is called volatile memory. Meanwhile, data stored in ROM is not lost even when power is not supplied. This type of memory is called nonvolatile memory.

The functions of semiconductor memory devices are gradually improved through the high degree of integration and an increase in the capacity and the chip size.

Recently, in order to further increase the degree of integration of semiconductor memory devices, active research is being done on a multi-bit cell which is able to store data in a single memory cell. This type of the memory cell is called a multi-level cell (MLC). A memory cell capable of storing one bit is called a single level cell (SLC).

FIG. 1 is a cross-sectional view of known memory cells.

Referring to FIG. 1, the memory cells MC1 to MC3s include floating gates FG and control gates CG formed over a substrate.

The substrate is divided into active regions and isolation regions. The active region is a region in which a channel is formed when operating voltages are supplied to the control gate CG.

Coupling is generated between the memory cells MC1 to MC3.

In FIG. 1, 'A' indicates coupling between the floating gates FG, and 'B' indicates coupling between the floating gate FG and the channel of the active region.

With a reduction in the size of a memory chip, a gap between the memory cells MC1 to MC3s is narrowed, thereby resulting in a reduction in the active region.

In a process of manufacturing memory cells, the concentration of impurities is decreased with a reduction of the active region and so a depletion region is reduced.

If the depletion region is reduced, current Ioff through a memory cell is increased even though it is turned off, and interference resulting from a bit line can become worse.

In other words, in case where the memory cells MC2 and MC3 are programmed with the memory cell MC1 being in a program state and the neighboring memory cells MC2 and MC3 being in an erase state, the threshold voltage of the memory cell MC1 may rise because of coupling influence due to a shift in the threshold voltages of the memory cells MC2 or MC3.

BRIEF SUMMARY

Exemplary embodiments relate to a semiconductor memory device and a method of operating the same, in which the depletion region of a memory cell is controlled by supplying a negative voltage to a P well when data is programmed into the memory cell or a verification operation for the program of the memory cell is performed.

A semiconductor memory device according to an aspect of the present disclosure includes memory blocks each comprising a plurality of memory cells formed over a semiconductor substrate having a P well, a first voltage generator supplying operating voltages to an selected block of the memory blocks, and a second voltage generator generating a negative voltage to the P well during a program operation.

The semiconductor memory device further includes a well voltage generator for transferring the negative voltage to the P well during the program operation or transferring an erase voltage to the P well or discharging voltage of the P well during an erase operation.

The second voltage generator includes a voltage level decoder for generating voltage level codes on the basis of negative voltage level information received from the control logic, a regulator for comparing the negative voltage and a target voltage determined by the voltage level codes and outputting a sense signal according to a result of the comparison, an oscillator for outputting first and second clocks in response to the sense signal, and a negative voltage pump for generating the negative voltage using the first and second clocks.

A semiconductor memory device according to another aspect of the present disclosure includes memory blocks comprising memory cells for storing data, a first voltage generator generating operating voltages for a program, read, or erase operation, a second voltage generator generating a negative voltage in response to a control signal, a well voltage generator supplying the operating voltages or the negative voltage to a P well of an selected memory block of the memory blocks, and a control logic enabling the second voltage generator to generate the negative voltage during a program operation and controlling the well voltage generator so that the negative voltage is supplied to the P well.

The second voltage generator includes a voltage level decoder for generating voltage level codes on the basis of negative voltage level information received from the control logic, a regulator for comparing the negative voltage and a target voltage determined by the voltage level codes and outputting a sense signal according to a result of the comparison, an oscillator for outputting first and second clocks in response to the sense signal, and a negative voltage pump for generating the negative voltage using the first and second clocks.

The well voltage generator includes an erase voltage transfer circuit for transferring the erase voltage to the P well or discharging the voltage of the P well and a negative voltage transfer circuit for transferring the negative voltage to the P well.

According to yet another aspect of the present disclosure, there is provided a method of operating a semiconductor memory device comprising memory blocks comprising memory cells for storing data, a first voltage pump supplying operating voltages which include a program voltage and verification voltages, and a negative voltage pump supplying a negative voltage. The method includes enabling the negative voltage pump in response to a program command, when the negative voltage is raised up to a predetermined target level, supplying the negative voltage to a P well of an selected memory block of the memory blocks, and performing the program command in the state in which the negative voltage is supplied to the P well.

The negative voltage is supplied to the P well while the program voltage and verification voltages are supplied to a word line of the selected memory block selected for a program operation.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
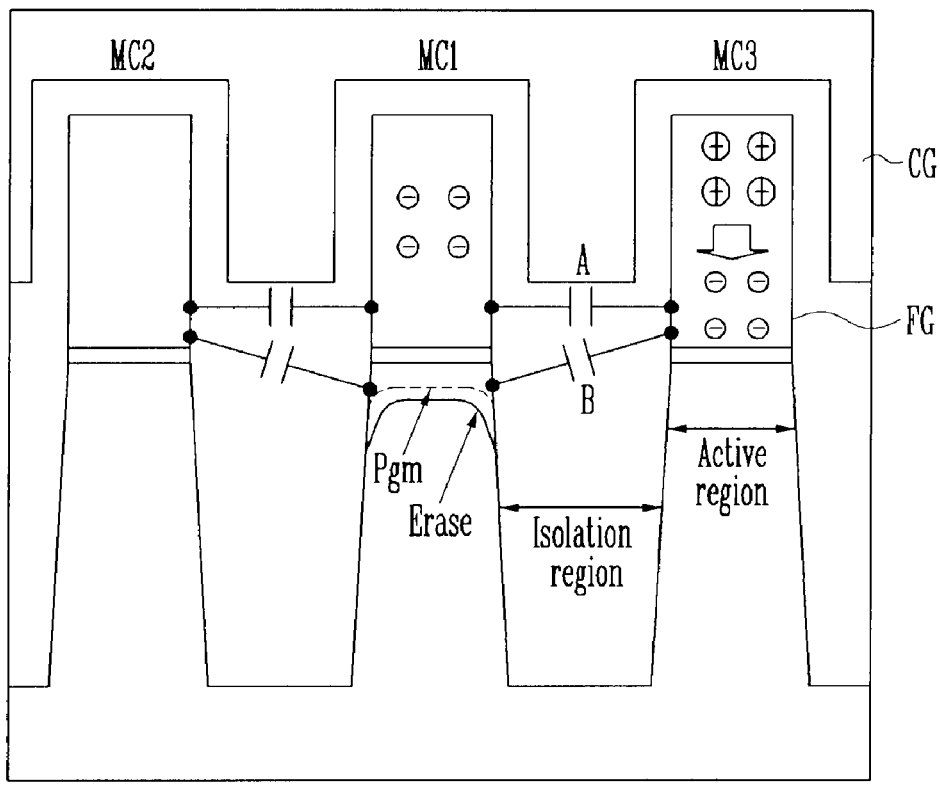
FIG. 1 is a cross-sectional view of known memory cells.
Figure 2:
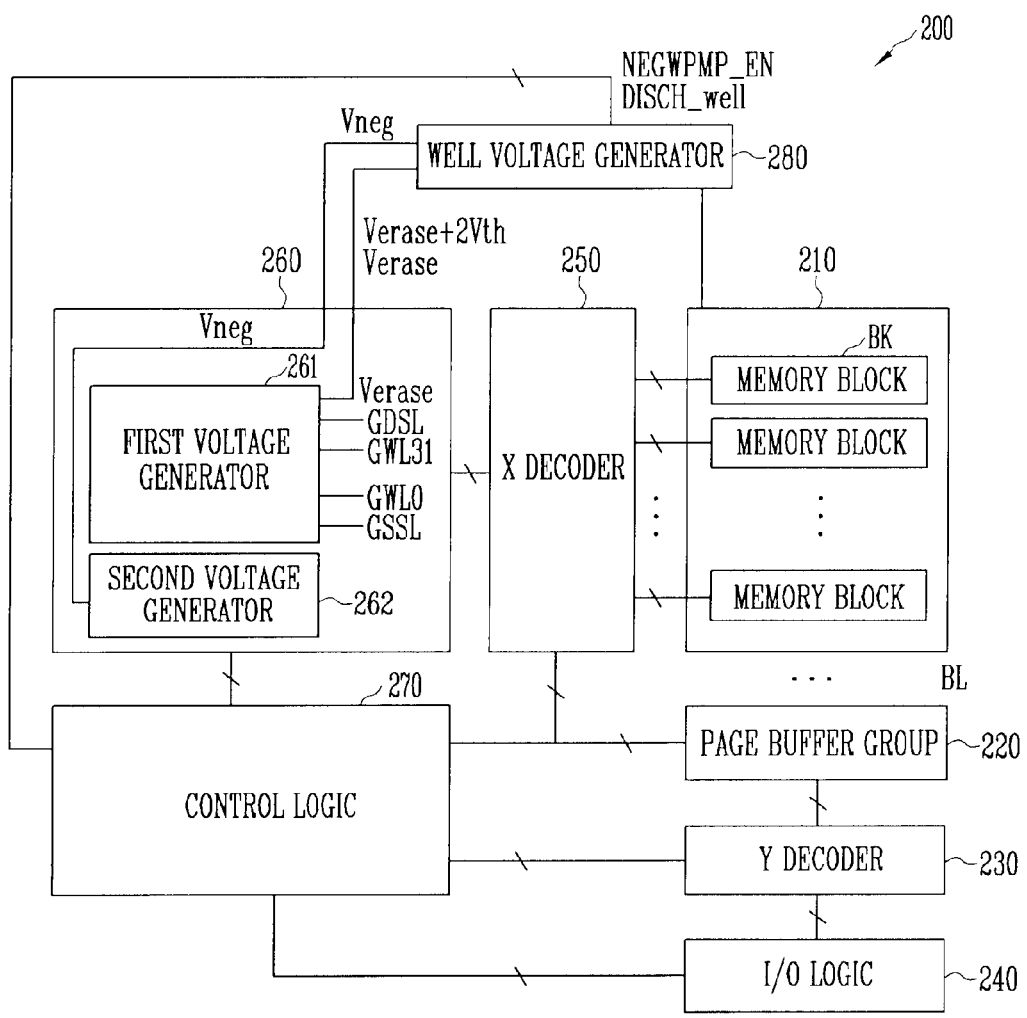
FIG. 2 is a block diagram of a semiconductor memory device according to an exemplary embodiment of this disclosure.

FIG. 2 is a block diagram of a semiconductor memory device according to an exemplary embodiment of this disclosure.

Referring to FIG. 2, the semiconductor memory device 200 includes a memory cell array 210, a page buffer group 220, a Y decoder 230, an I/O logic 240, an X decoder 250, a voltage generator 260, a control logic 270, and a well voltage generator 280.

The memory cell array 210 includes a plurality of memory blocks BK.

Each of the memory blocks BK includes a plurality of cell strings CS. Each of the cell strings CS includes a plurality of memory cells coupled in series.

The cell string CS is coupled to a bit line BL.

The page buffer group 220 includes page buffers coupled to the bit lines BL of the memory cell array 210.

The page buffer is configured to temporarily store data to be programmed into the memory cells and driven when a program operation is performed. The page buffer is driven when a read operation is performed, thus reading data programmed into the memory cells and temporarily storing the read data.

The Y decoder 230 provides an I/O path between the I/O logic 240 and the page buffers of the page buffer group 220 in response to a control signal.

The I/O logic 240 performs data I/O between external systems (not shown) to which the semiconductor memory device 200 is applied.

The X decoder 250 enables one of the memory blocks BK of the memory cell array 210 in response to a control signal generated by the control logic 270.

Operating voltages generated by the voltage generator 260 are supplied to the memory block BK enabled by the X decoder 250.

The voltage generator 260 includes first and second voltage generators 261 and 262. The first voltage generator 261 generates positive voltages such as a program voltage, a read voltage, a verification voltage, a pass voltage, and an erase voltage Verase.

The second voltage generator 262 generates a negative voltage Vneg which will be supplied to a P well when a program or verification operation is performed.

The first and second voltage generators 261 and 262 are enabled in response to a control signal generated by the control logic 270. The voltage level or the voltage output timing of the first and second voltage generators 261 and 262 are controlled by the control logic 270.

The control logic 270 outputs the control signals for controlling the operations of the page buffer group 220, the Y decoder 230, the I/O logic 240, the X decoder 250, and the voltage generator 260 in response to an operation command received via the I/O logic 240.

When a program or verification operation is performed, the control logic 270 generates a control signal such that the negative voltage Vneg is supplied to the P well of the memory cell array 210.

When an erase operation is performed, the well voltage generator 280 transfers the erase voltage Verase, generated by the first voltage generator 261, to the P well of the memory cell array 210.

When a program or verification operation is performed, the well voltage generator 280 transfers the negative voltage Vneg, generated by the second voltage generator 262, to the P well of the memory cell array 210.

Figure 3:
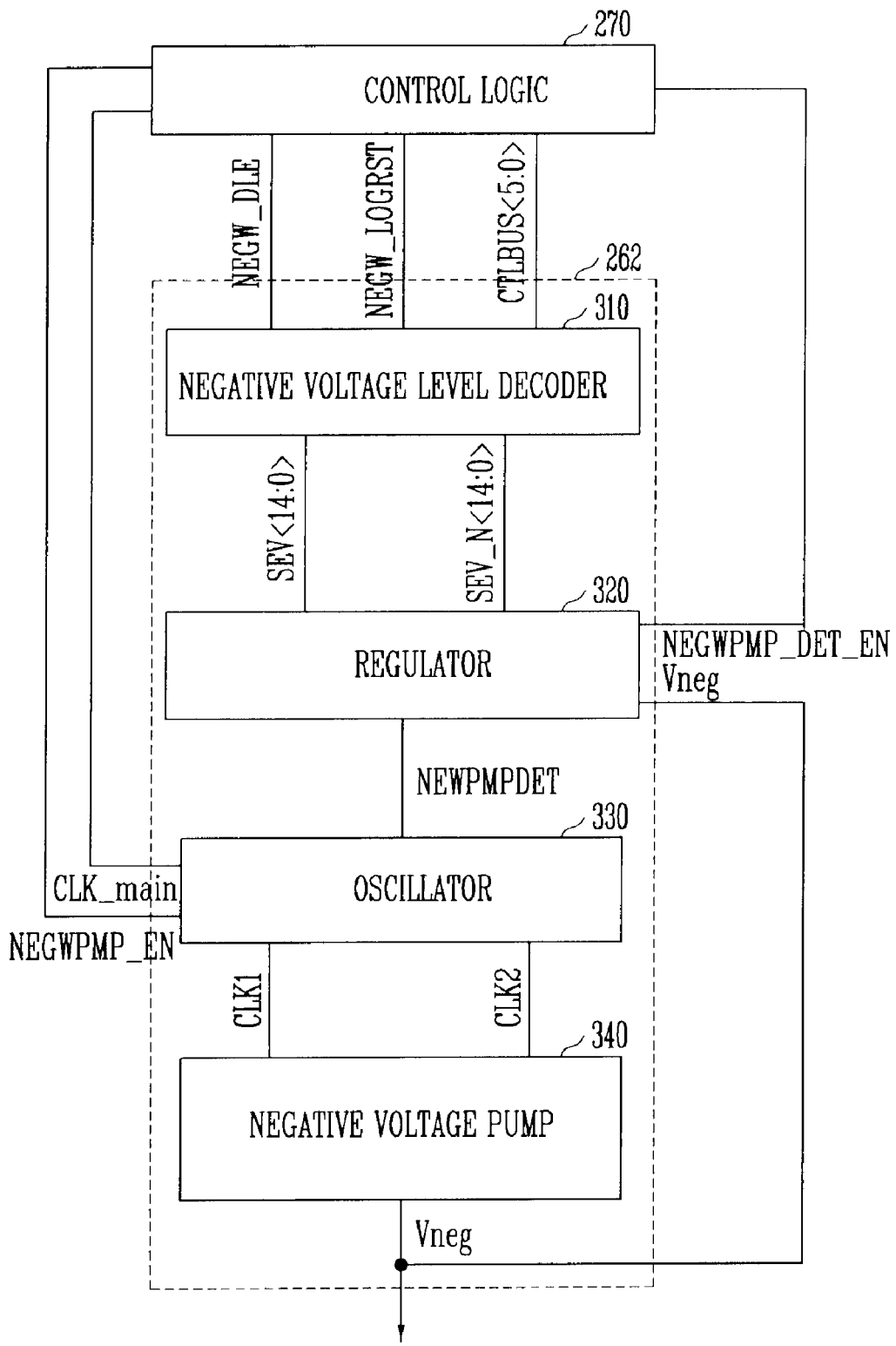
FIG. 3 is a block diagram of a second voltage generator shown in FIG. 2.

FIG. 3 is a block diagram of the second voltage generator 262 shown in FIG. 2.

Referring to FIG. 3, the second voltage generator 262 includes a negative voltage level decoder 310, a regulator 320, an oscillator 330, and a negative voltage pump 340.

The negative voltage level decoder 310 outputs pieces of negative voltage level information SEV<14:0> and SEV_N<14:0> about the negative voltage Vneg to be generated by the negative voltage pump 340 on the basis of pieces of negative voltage information CTLBUS<5:0> generated by the control logic 270.

The control logic 270 first inputs a reset signal NEGW_LOGRST of a high level to the negative voltage level decoder 310. The negative voltage level decoder 310 is reset in response to the reset signal NEGW_LOGRST of a high level.

The control logic 270 inputs a data latch enable signal NEGW_DLE of a high level to the negative voltage level decoder 310. The negative voltage information CTLBUS<5:0> is outputted through a control bus.

The negative voltage level decoder 310 receives the negative voltage information CTLBUS<5:0> in response to the data latch enable signal NEGW_DLE of a high level.

The regulator 320 checks a voltage level of the negative voltage Vneg to be generated by the negative voltage pump 340 on the basis of the negative voltage level information SEV<14:0> and SEVN<14:0> and generates a sense signal NEGWPMPDET according to a result of the check.

The regulator 320 compares a target negative voltage level determined by the negative voltage level information SEV<14:0> and SEV_N<14:0> and the negative voltage Vneg outputted by the negative voltage pump 340. If, as a result of the comparison, the negative voltage Vneg is higher than the target negative voltage level, the regulator 320 generates the sense signal NEGWPMPDET of a high level.

The regulator 320 starts operating in response to a sense enable signal NEGWPMP_DET_EN generated by the control logic 270. If the negative voltage Vneg of the negative voltage pump 340 is lower than the target negative voltage level, the regulator 320 generates the sense signal NEGWPMPDET of a low level.

The oscillator 330 generates first and second clocks CLK1 and CLK2 on the basis of a main clock CLK_main, generated by the control logic 270, in response to the sense signal NEGWPMPDET. If the sense signal NEGWPMPDET is in a high level, the oscillator 330 generates the first and second clocks CLK1 and CLK2.

However, if the sense signal NEGWPMPDET is in a low level, the oscillator 330 does not generate the first and second clocks CLK1 and CLK2.

The negative voltage pump 340 generates the negative voltage Vneg in response to the first and second clocks CLK1 and CLK2. If the first and second clocks CLK1 and CLK2 are not received, the negative voltage pump 340 does not generate the negative voltage Vneg. According to an exemplary embodiment of this disclosure, the negative voltage Vneg generated by the negative voltage pump 340 ranges from 0 V to −2 V.

The negative voltage Vneg generated by the negative voltage pump 340 is inputted to the well voltage generator 280.

A detailed construction of the well voltage generator 280 is described below with reference to FIG. 4.

Figure 4:
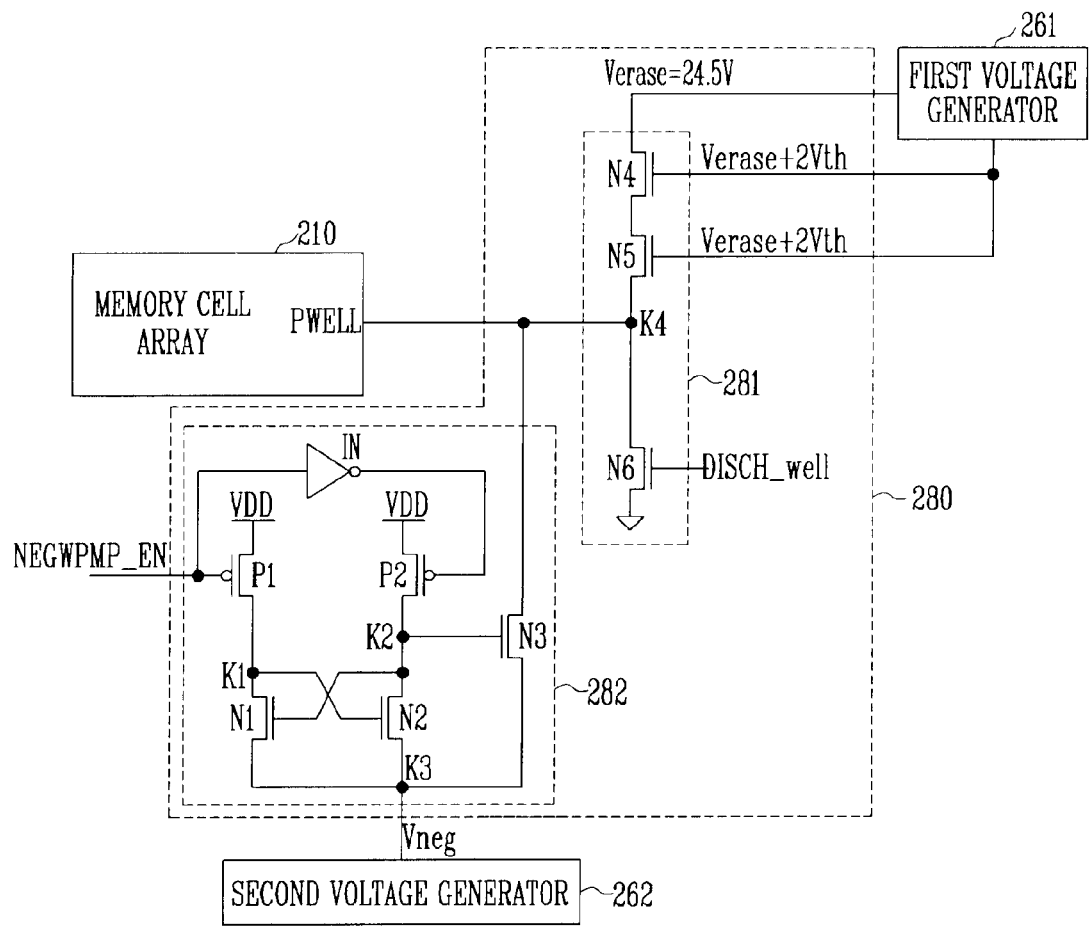
FIG. 4 is a circuit diagram of a well voltage generator shown in FIG. 2.

FIG. 4 is a circuit diagram of the well voltage generator 280 shown in FIG. 2.

Referring to FIG. 4, the well voltage generator 280 includes an erase voltage transfer circuit 281 and a negative voltage transfer circuit 282.

The erase voltage transfer circuit 281 includes fourth to sixth NMOS transistors N4 to N6. The negative voltage transfer circuit 282 includes first and second PMOS transistors P1 and P2, first to third NMOS transistors N1 to N3, and an inverter IN.

The first to third NMOS transistors N1 to N3 and the fifth and sixth NMOS transistors N5 and N6 form a high voltage transistor.

The fourth to sixth NMOS transistors N4 to N6 are coupled in series between a ground node and an input terminal for the erase voltage Verase generated by the first voltage generator 261.

A control voltage Verase+2Vth is inputted to each of the fourth and fifth NMOS transistors N4 and N5. Here, 'Vth' is a threshold voltage of each of the fourth and fourth NMOS transistors N4 and N5.

A discharge control signal DISCH_well generated by the control logic 270 is inputted to the gate of the sixth NMOS transistor N6.

A node K4 between the fifth and sixth NMOS transistors N5 and N6 is coupled to the P well of the memory cell array 210.

When an erase operation is performed, the first voltage generator 261 outputs the erase voltage Verase and the control voltage Verase+2Vth to the well voltage generator 280. Here, the discharge control signal DISCH_well of a low level is inputted to the sixth NMOS transistor N6.

When the fourth and fifth NMOS transistors N4 and N5 are turned on in response to the control voltage Verase+2Vth, the erase voltage Verase is supplied to the P well.

In order to discharge the voltage of the P well after the erase operation, the control voltage Verase+2Vth shifts to a level 0 V, and the discharge control signal DISCH_well of a high level is inputted to the sixth NMOS transistor N6.

In response to the discharge control signal DISCH_well of a high level, the sixth NMOS transistor N6 is turned on. When the sixth NMOS transistor N6 is turned on, the P well of the memory cell array 210 is coupled to the ground node. Accordingly, the erase voltage Verase supplied to the P well is discharged.

The first PMOS transistor P1 and the first NMOS transistor N1 of the negative voltage transfer circuit 282 are coupled in series between a node K3 and an input terminal for a power source voltage VDD. The node K3 is an output terminal where the second voltage generator outputs the negative voltage Vneg.

A negative voltage pump enable signal NEGWPMP_EN is inputted to the gate of the first PMOS transistor P1. The gate of the first NMOS transistor N1 is coupled to a node K2. The node K2 is where the second PMOS transistor P2 and the second NMOS transistor N2 are coupled to each other.

The inverter IN inverts the negative voltage pump enable signal NEGWPMP_EN and outputs the negative voltage pump enable signal NEGWPMP_EN of an inverted level.

The second PMOS transistor P2 and the second NMOS transistor N2 are coupled in series between the node K3 and the input terminal for the power source voltage VDD.

The output of the inverter IN is inputted to the gate of the second PMOS transistor P2. That is, the negative voltage pump enable signal NEGWPMP_EN of an inverted level is inputted to the gate of the second PMOS transistor P2.

The gate of the second NMOS transistor N2 is coupled to a node K1. The node K1 is where the first NMOS transistor N1 and the first PMOS transistor P1 are coupled to each other.

The third NMOS transistor N3 is coupled between the node K4 and the node K3. The gate of the third NMOS transistor N3 is coupled to the node K2.

The negative voltage Vneg of the second voltage generator 262 is applied at the node K3.

When the negative voltage pump enable signal NEGWPMP_EN of a high level is inputted to the negative voltage transfer circuit 282, the second PMOS transistor P2 is turned on.

When the second PMOS transistor P2 is turned on, the power source voltage VDD is transferred to the node K2, and so the third NMOS transistor N3 is also turned on. Accordingly, the P well and the node K3 are coupled together.

That is, the negative voltage Vneg can be supplied to the P well of the memory cell array 210.

However, if the negative voltage pump enable signal NEGWPMP_EN of a low level is inputted to the negative voltage transfer circuit 282, the first PMOS transistor P1 is turned on. When the first PMOS transistor P1 is turned on, the power source voltage VDD is supplied to the node K1.

When the power source voltage VDD is supplied to the node K1, the second NMOS transistor N2 is turned on, and so the node K3 and the node K2 are coupled together.

That is, since the negative voltage Vneg is inputted to the node K2 through the node K3, the negative voltage Vneg is supplied to the gate and drain of the third NMOS transistor N3 at the same time.

Accordingly, the third NMOS transistor N3 is turned off.

If the negative voltage Vneg is not inputted to the gate of the third NMOS transistor N3, the third NMOS transistor N3 may not be turned off because the negative voltage Vneg is inputted to the drain of the third NMOS transistor N3. In this case, since the negative voltage Vneg continues to be supplied to the P well, operational error may occur.

In order to prevent this problem, the negative voltage Vneg is supplied to the gate of the third NMOS transistor N3 as described above such that the third NMOS transistor N3 is surely turned off.

In the semiconductor memory device 200 according to the exemplary embodiment of this disclosure described with reference to FIGS. 2 to 4, when a program or verification operation is performed, the negative voltage Vneg can be supplied to the P well.

Figure 5:
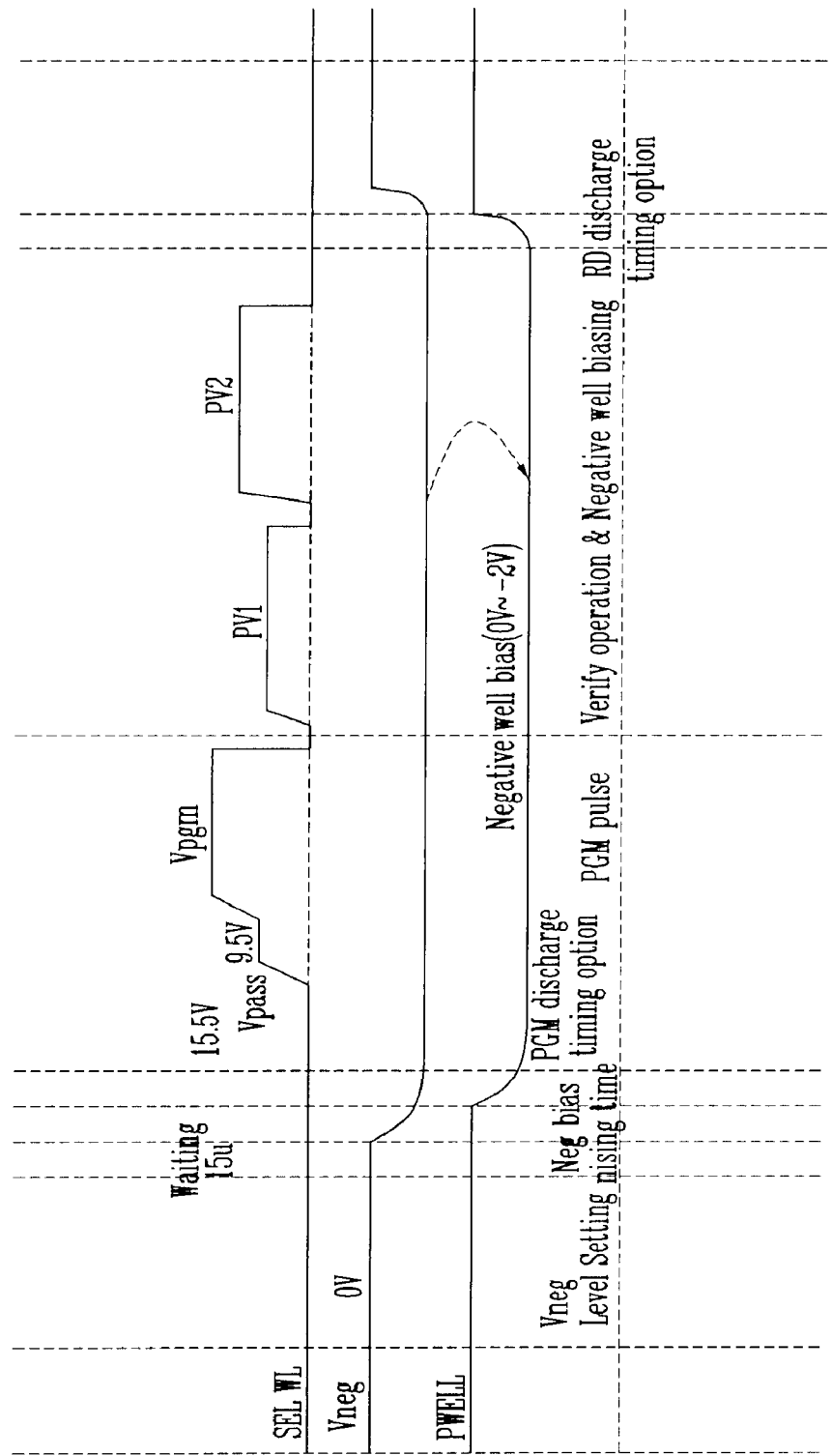
FIG. 5 is a timing diagram illustrating a program operation according to a first embodiment of this disclosure.

FIG. 5 is a timing diagram illustrating a program operation according to a first embodiment of this disclosure.

Referring to FIG. 5, a program operation according to the exemplary embodiment of this disclosure is similar to a known program operation except that the negative voltage is inputted to the P well during a program operation.

More particularly, when the program operation is performed, the control logic 270 outputs the control signal to the first voltage generator 261 such that the first voltage generator 261 generates a program voltage Vpgm, verification voltages PV1 and PV2, and a pass voltage Vpass.

The control logic 270 outputs the reset signal NEG-W_LOGRST, the data latch enable signal NEGW_DLE, the negative voltage information CTLBUS<5:0>, the negative voltage pump enable signal NEGWPMP_EN, and the sense enable signal NEGWPMP_DET_EN to the second voltage generator 262.

The second voltage generator 262 starts generating the negative voltage Vneg as described above with respect to FIG. 3.

Before the program voltage Vpgm is inputted to a selected word line SEL WL for the program operation, the negative voltage Vneg is raised up to a target voltage level.

The negative voltage Vneg is supplied to the P well during the time for which the program voltage Vpgm and the verification voltages PV1 and PV2 are sequentially supplied.

Figure 6:
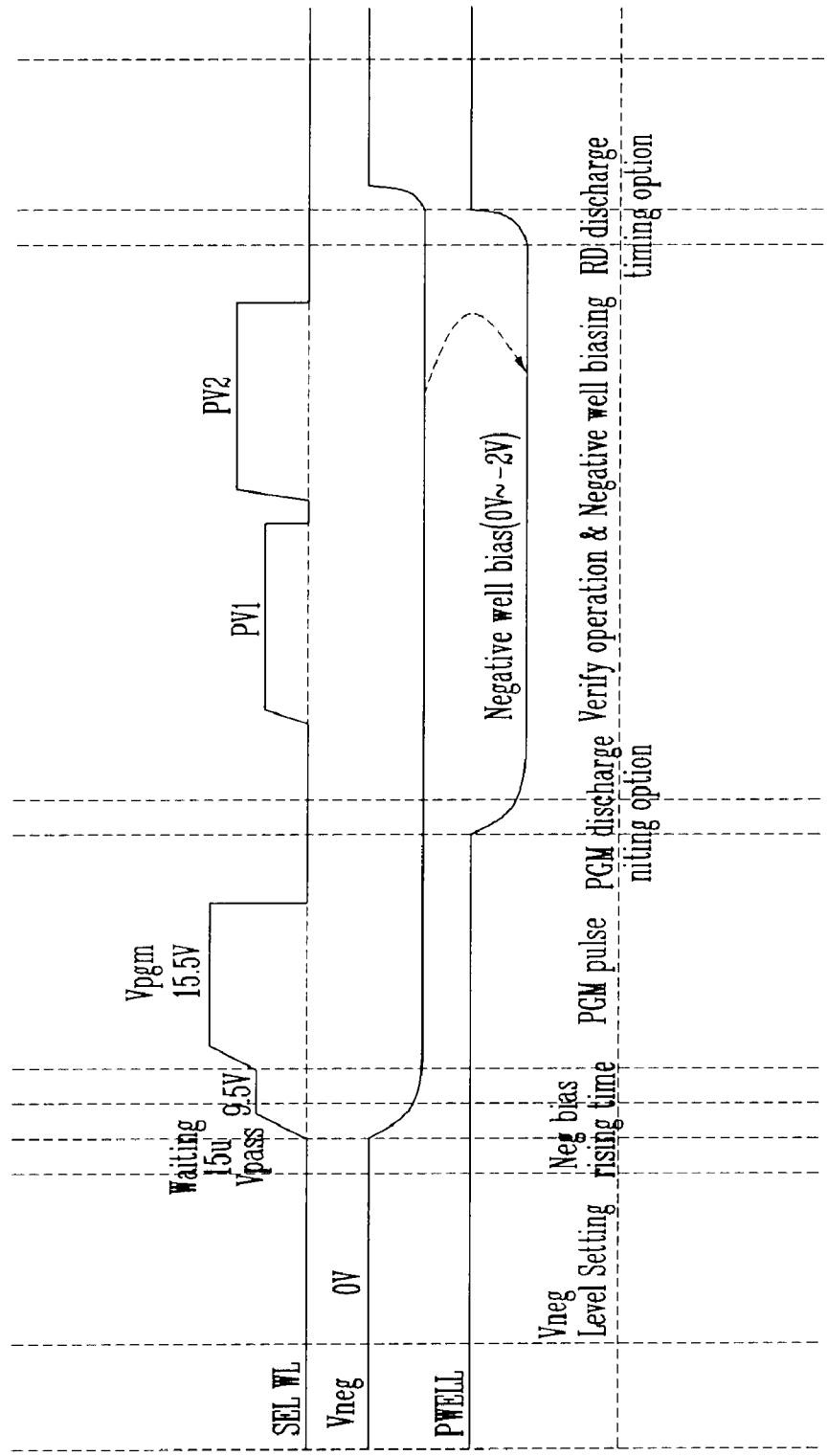
FIG. 6 is a timing diagram illustrating a program operation according to a second embodiment of this disclosure.

Furthermore, the negative voltage Vneg may not be supplied to the P well during the time for which the program voltage Vpgm is inputted to the selected word line SEL WL as shown in FIG. 6, but may be supplied to the P well only during the time for which the negative voltage Vneg is inputted.

FIG. 6 is a timing diagram illustrating a program operation according to a second embodiment of this disclosure.

Referring to FIG. 6, the negative voltage Vneg is not supplied to the P well during the time for which the program voltage Vpgm is supplied to the selected word line SEL WL as compared with FIG. 5. However, the second voltage generator 262 is already generating the negative voltage Vneg raised up to the target voltage level.

After the program operation voltage Vpgm is supplied and then discharged, the negative voltage Vneg is supplied to the P well. The verification voltages PV1 and PV2 are inputted to the selected word line SEL WL.

During the time for which the verification voltages PV1 and PV2 are supplied, the negative voltage Vneg continues to be supplied to the P well.

Figure 7:
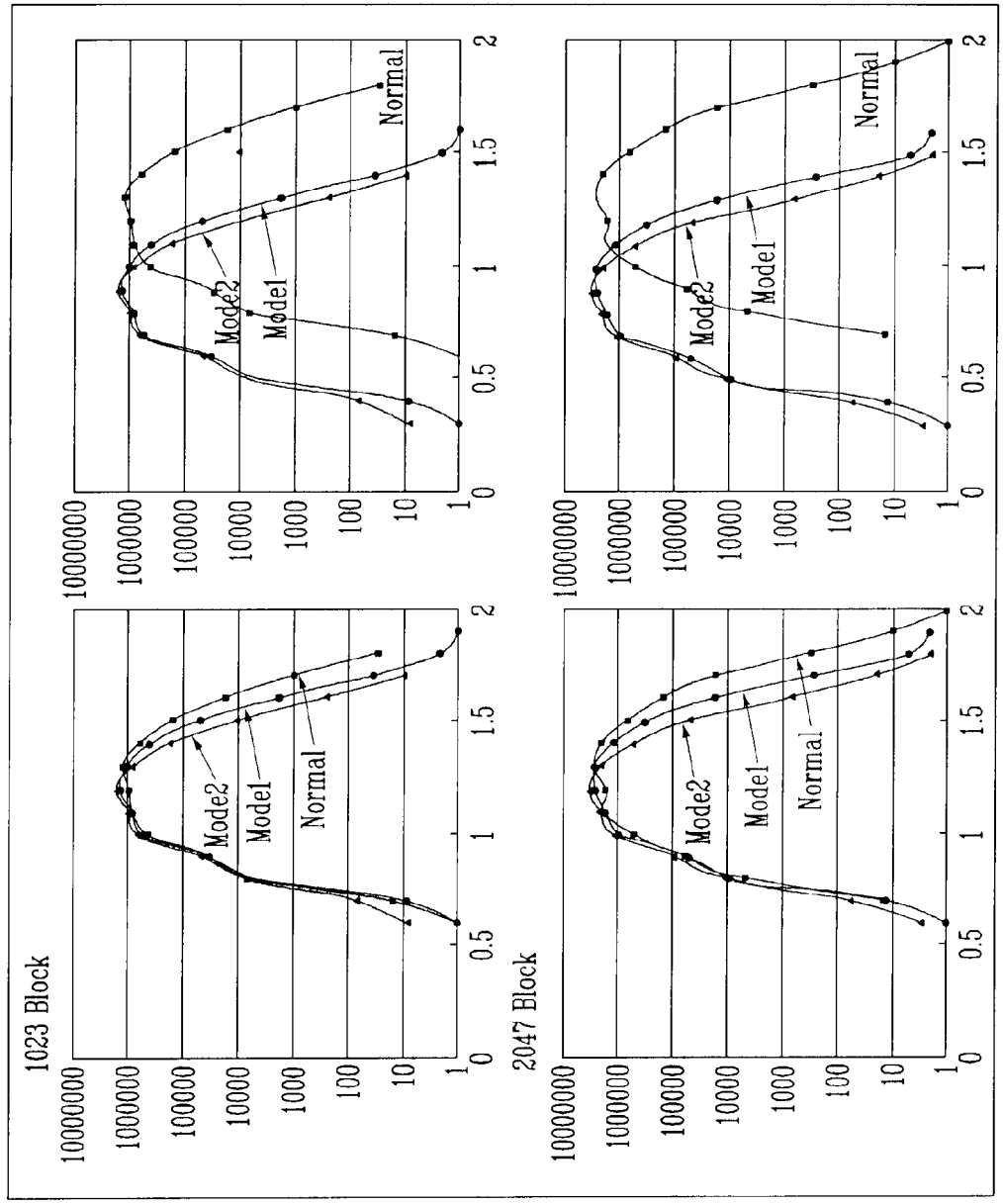
FIG. 7 is a graph showing the results of simulating threshold voltage distributions in case where a program operation is performed as in the first and second embodiments of this disclosure and in case where a known program operation is performed.
Figure 8:
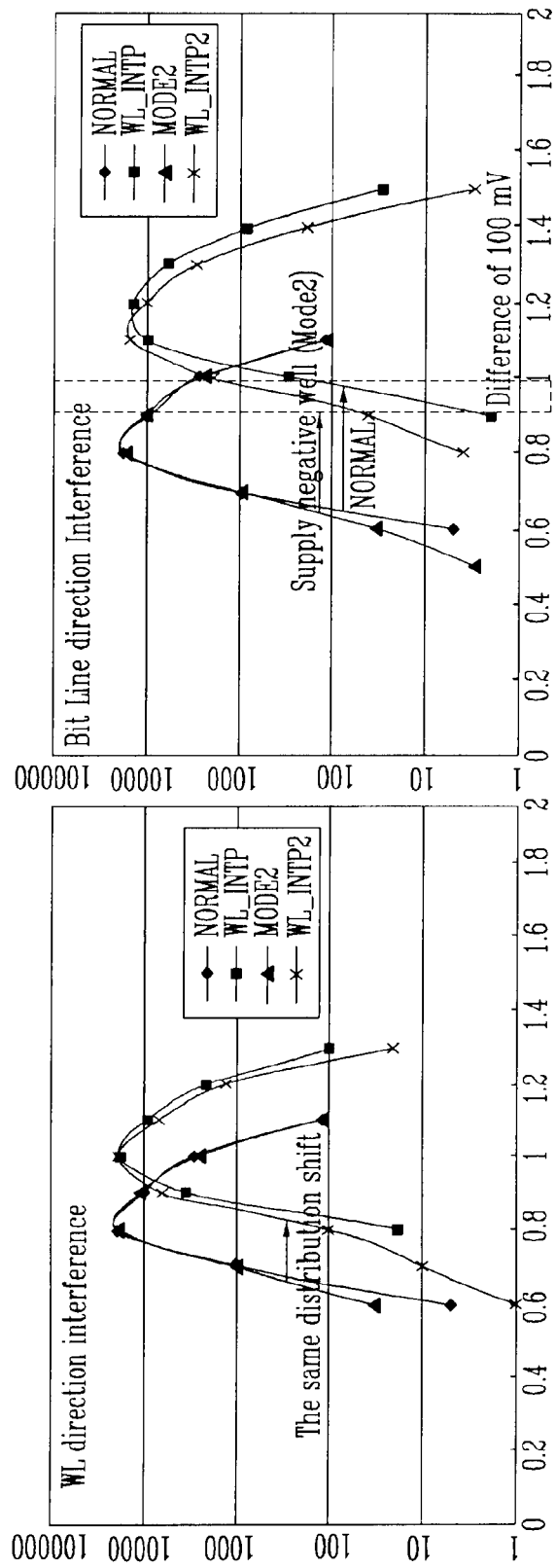
FIG. 8 is a graph showing the results of simulating interference phenomena in case where a program operation is performed as in the first and second embodiments of this disclosure and in case where a known program operation is performed.

Assuming that the program operation according to the first embodiment of FIG. 5 is referred to as a first mode model and the program operation according to the second embodiment of FIG. 6 is referred to as a second mode mode2, FIGS. 7 and 8 are graphs showing the results of simulating threshold voltage distributions between the first and second modes model and mode2 and a normal mode in which the negative voltage Vneg.

FIG. 7 is a graph showing the results of simulating threshold voltage distributions in case where a program operation is performed as in the first and second embodiments of this disclosure and in case where a known program operation is performed. FIG. 8 is a graph showing the results of simulating interference phenomena in case where a program operation is performed as in the first and second embodiments of this disclosure and in case where a known program operation is performed.

From FIG. 7, it can be seen that a width of the threshold voltages is reduced in the embodiments of this disclosure (model and model) in which the negative voltage Vneg is supplied to the P well when the program operation is performed, as compared with the normal mode.

From FIG. 8, it can be seen that the degree that the threshold voltages of memory cells having the same threshold voltage distribution shift because of an interference phenomenon is about 100 mV between the second mode model and the normal mode.

As described above, in the semiconductor memory device and the method of operating the same according to the exemplary embodiments of this disclosure, the depletion region of a memory cell is controlled by supplying the negative voltage to the P well when a program or program verification operation is performed. Since the depletion region of the memory cell is controlled, the leakage current of the memory cell flowing when the memory cell is in a turn-off state can be reduced and so the influence of a bit line can be reduced.

What is claimed is:

1. A semiconductor memory device, comprising:
memory blocks each comprising a plurality of memory cells formed over a semiconductor substrate having a P well;
a first voltage generator supplying operating voltages to an selected block of the memory blocks; and
a second voltage generator generating a negative voltage to be supplied to the P well during a time for which a verification voltage is supplied to a selected word line of the memory cells.

2. The semiconductor memory device of claim 1, further comprising a well voltage generator configurable to transfer the negative voltage to the P well during the program operation, to transfer an erase voltage to the P well, and to discharge voltage of the P well during an erase operation.

3. The semiconductor memory device of claim 2, wherein the well voltage generator and the second voltage generator are controlled in response to a control signal generated by a control logic.

4. The semiconductor memory device of claim 3, wherein the second voltage generator comprises: a voltage level decoder for generating voltage level codes on the basis of negative voltage level information received from the control logic; a regulator for comparing the negative voltage and a target voltage determined by the voltage level codes and outputting a sense signal according to a result of the comparison; an oscillator for outputting first and second clocks in response to the sense signal; and a negative voltage pump for generating the negative voltage using the first and second clocks.

5. The semiconductor memory device of claim 4, wherein the well voltage generator comprises: an erase voltage transfer circuit configurable to transfer the erase voltage to the P well and to discharge the voltage of the P well; and a negative voltage transfer circuit configurable to transfer the negative voltage to the P well.

6. The semiconductor memory device of claim 5, wherein the negative voltage transfer circuit comprises a transistor coupled between the P well and a source of the negative voltage, wherein a gate and drain of the transistor is held to substantially the negative voltage when the negative voltage is not applied to the P well.

7. The semiconductor memory device of claim 3, wherein during the program operation the control logic controls the negative voltage such that the negative voltage is supplied to the P well before a program voltage is supplied until a program verification operation is terminated.

8. The semiconductor memory device of claim 3, wherein during the program operation the control logic controls the negative voltage such that the negative voltage is supplied to the P well before a program verification operation is started until the program verification operation is terminated.

9. The semiconductor memory device of claim 1, wherein the second voltage generator generates the negative voltage to be supplied to the P well during a time for which verification voltages are supplied to the selected word line.

10. A semiconductor memory device, comprising:
   memory blocks comprising memory cells for storing data;
   a first voltage generator generating operating voltages for a program, read, and erase operations;
   a second voltage generator generating a negative voltage in response to a control signal;
   a well voltage generator supplying one of the operating voltages and the negative voltage to a P well of a selected memory block of the memory blocks; and
   a control logic enabling the second voltage generator to generate the negative voltage during a program operation and controlling the well voltage generator so that the negative voltage is supplied to the P well.

11. The semiconductor memory device of claim 10, wherein: the operating voltages comprise a program voltage, a pass voltage, verification voltages, and an erase voltage, and the erase voltage is supplied to the well voltage generator.

12. The semiconductor memory device of claim 11, wherein the second voltage generator comprises: a voltage level decoder for generating voltage level codes on the basis of negative voltage level information received from the control logic; a regulator for comparing the negative voltage and a target voltage determined by the voltage level codes and outputting a sense signal according to a result of the comparison; an oscillator for outputting first and second clocks in response to the sense signal; and a negative voltage pump for generating the negative voltage using the first and second clocks.

13. The semiconductor memory device of claim 11, wherein the well voltage generator comprises: an erase voltage transfer circuit configurable to transfer the erase voltage to the P well, and to discharge the voltage of the P well; and a negative voltage transfer circuit for transferring the negative voltage to the P well.

14. The semiconductor memory device of claim 13, wherein the negative voltage transfer circuit comprises a transistor coupled between the P well and a source of the negative voltage, wherein a gate and drain of the transistor is held to substantially the negative voltage when the negative voltage is not applied the P well.

15. The semiconductor memory device of claim 10, wherein during the program operation the control logic controls the negative voltage such that the negative voltage is supplied to the P well before a program voltage is supplied until a program verification operation is terminated.

16. The semiconductor memory device of claim 9, wherein during the program operation the control logic controls the negative voltage such that the negative voltage is supplied to the P well before a program verification operation is started until the program verification operation is terminated.

17. A method of operating a semiconductor memory device, comprising memory blocks comprising memory cells for storing data, a first voltage pump supplying operating voltages which includes a program voltage and verification voltages, and a negative voltage pump supplying a negative voltage, the method comprising:
   enabling the negative voltage pump in response to a program command;
   supplying the negative voltage to a P well of an selected memory block of the memory blocks when the negative voltage is raised up to a predetermined target level; and
   performing the program command in the state in which the negative voltage is supplied to the P well.

18. The method of claim 17, wherein the negative voltage is supplied to the P well while the program voltage and verification voltages are supplied to a word line of the selected memory block selected for a program operation.

19. The method of claim 18, wherein the negative voltage is supplied to the P well while the verification voltages are supplied to the selected word line.

* * * * *